(12) United States Patent
Devilliers et al.

(10) Patent No.: US 9,780,290 B2
(45) Date of Patent: Oct. 3, 2017

(54) PRECISION RETURN ACTUATOR

(71) Applicants: THALES, Neuilly-sur-Seine (FR); CEDRAT TECHNOLOGIES, Meylan (FR)

(72) Inventors: Christophe Devilliers, Cannes la Bocca (FR); Félix Aguilar, Cannes la Bocca (FR); Julien Ducarne, Cannes la Bocca (FR); Francois Barillot, Meylan (FR); Frank Claeyssen, Meylan (FR)

(73) Assignees: THALES, Courbevoie (FR); CEDRAT TECHNOLOGIES, Meylan (FR)

( * ) Notice: Subject to any disclaimer, the term of this patent is extended or adjusted under 35 U.S.C. 154(b) by 416 days.

(21) Appl. No.: 14/572,558

(22) Filed: Dec. 16, 2014

(65) Prior Publication Data

US 2015/0171308 A1 Jun. 18, 2015

(30) Foreign Application Priority Data

Dec. 18, 2013 (FR) .................................... 13 02978

(51) Int. Cl.
*H01L 41/09* (2006.01)
*H01L 41/12* (2006.01)
*H02N 2/02* (2006.01)
*H02N 2/06* (2006.01)

(52) U.S. Cl.
CPC .......... *H01L 41/0986* (2013.01); *H01L 41/12* (2013.01); *H02N 2/02* (2013.01); *H02N 2/06* (2013.01)

(58) Field of Classification Search
USPC ........ 310/328, 330–332, 326, 355, 317, 327
See application file for complete search history.

(56) References Cited

U.S. PATENT DOCUMENTS

| 4,423,347 | A | * | 12/1983 | Kleinschmidt | .......... | H02N 2/02 |
|---|---|---|---|---|---|---|
| | | | | | | 310/326 |
| 4,765,140 | A | | 8/1988 | Imoto et al. | | |
| 2004/0183401 | A1 | | 9/2004 | Lubitz et al. | | |
| 2009/0167113 | A1 | * | 7/2009 | Dixon | .................... | B41J 25/001 |
| | | | | | | 310/328 |
| 2014/0152151 | A1 | * | 6/2014 | Potemkin | ............ | H01L 41/0471 |
| | | | | | | 310/328 |

FOREIGN PATENT DOCUMENTS

| DE | 10042941 A1 | 3/2002 |
|---|---|---|
| EP | 2639844 A1 | 9/2013 |
| SU | 640 385 A1 | 12/1978 |

* cited by examiner

*Primary Examiner* — Thomas Dougherty
*Assistant Examiner* — Karen B Addison
(74) *Attorney, Agent, or Firm* — Baker & Hostetler LLP

(57) ABSTRACT

A nanometer-scale precision actuator comprises a base, an intermediate structure, an output interface, and two linear elements producing a controllable extension in the same longitudinal direction, each between a first and a second end. A first of the two elements has a first end fixed onto the intermediate structure and a second end fixed onto the base, a second of the two elements has a first end fixed onto the intermediate structure and a second end fixed to the output interface. The base and the intermediate structure are positioned in such a manner that the controllable extension of the second element produces a displacement of the actuator in a first direction and the controllable extension of the first element produces a displacement of the actuator in a second direction, opposite to the first direction, with respect to the base.

8 Claims, 3 Drawing Sheets

PRECISION RETURN ACTUATOR

CROSS-REFERENCE TO RELATED APPLICATION

This application claims priority to foreign French patent application No. FR 1302978, filed on Dec. 18, 2013, the disclosure of which is incorporated by reference in its entirety.

FIELD OF THE INVENTION

The invention relates to a nanometer-scale precision actuator and can, for example, be used in the field of space applications for an active optics application.

BACKGROUND

A telescope has a main mirror, also called primary mirror. The primary mirror concentrates the light rays toward a secondary mirror which reflects them back to the focal point of the telescope. The primary mirror must not deform under the effect of gravity for example. Often, an intermediate deformable mirror is used to correct the defects of the primary mirror. And the intermediate mirror is deformed by one or more actuators.

For an active optics application, an actuator with a very high precision and stability is sought. It may even be desirable to have a nanometer-level precision, in other words of the order of a nanometer. Ideally, the actuator must operate at best around its initial position. This is what is also referred to as having symmetrical travel around the mechanical zero. Lastly, its coefficient of expansion, denoted CTE in the literature, must be as low as possible.

In various fields of application, precision actuators are required. From amongst the precision actuators, piezoelectric actuators may be mentioned.

The direct piezoelectric effect is the property according to which the application of a mechanical load to certain crystals or ceramics causes electrical charges to appear on the surface of the material. The direct piezoelectric effect may be exploited in the design of sensors such as pressure sensors.

The inverse piezoelectric effect is the property of deformation of a piezoelectric material when an electric field is applied to it. The inverse piezoelectric effect allows actuators to be designed.

There exist a very large number of piezoelectric materials. The most well known is quartz. However, it is the synthetic ceramics PZT (for lead zirconium titanate, also known as LZT in the literature) that are just as widely used today in the industry.

There exist two main types of piezoelectric actuators. The first type of actuator is called a direct actuator, in which the displacement obtained is equal to the deformation of the piezoelectric material. Direct actuators allow a travel of between 0 and 100 micrometers to be obtained. The second type of actuator comprises amplified actuators, in which a mechanical device amplifies this movement by a factor of 2 to 20. Amplified actuators generally have a travel in the range between 0.1 mm and 1 mm.

Today, it is multilayer ceramics (also known as MLA for Multi-Layer Array in the literature) that are conventionally used in piezoelectric actuators. The integration of this type of material imposes specific precautions. The necessity to provide a mechanical pre-stressing or to avoid torsion forces may in particular be mentioned. With the proviso of a good design and implementation, piezoelectric actuators are extremely reliable and robust.

Their reliability and robustness have enabled piezoelectric actuators to be used in the field of space applications. They are also used, for example, for nanopositioning, the creation of vibrations, and the active control of vibrations.

Today, aside from the field of space applications, piezoelectric actuators are used in several areas. The following may notably be mentioned:
- in industry for machining assistance by creation of vibrations;
- the control of certain injectors in the automobile industry carried out by virtue of piezoelectric materials. This technique notably allows the process of fuel injection to be well controlled;
- some inkjet printers using piezoelectric elements for producing the fine droplets which are propelled onto the paper.

Currently, a piezoelectric actuator with pre-stressing is used to deform the intermediate mirror. At rest, the actuator is said to be at its initial or reference position, also referred to as the position of the mechanical zero. The travel of such an actuator is asymmetric. For example, the actuator has a travel in the range between −5 µm and +40 µm. The difficulty resides in the center-shift of the travel which implies having a significant offset of the voltage in the central position. In this case, the initial position is no longer the desired mechanical zero.

Another solution consists in using two actuators connected in opposition (also referred to as "push-pull" in the literature) where their forces are added together. Each actuator must deform the other when it is actuated. This solution only allows a limited travel. More precisely, the actuators have a complementary displacement. However, the asymmetry of the displacement leads to a residual force at the mid-point or at rest. The series push-pull doubles the force for a constant travel.

Thus, it is observed that the use of a piezoelectric actuator alone does not allow a desired symmetrical travel to be obtained. It is necessary to pre-stress the system and to offset the mechanical zero. This renders problematic a potential case of failure where the actuator gets blocked in an end position.

The use of an actuator in "push-pull" mode is a known and advantageous solution. Nevertheless, it reduces the total travel of the actuator and imposes the use of large actuators in order to obtain the desired travel.

Lastly, the use of an actuator with a micromotor, a reducer and a screw allowing a de-multiplication to be obtained is advantageous. Nevertheless, the de-multiplication increases the requirement in travel of the actuator which may then become too large. This type of actuator cannot therefore be envisioned for a space application.

SUMMARY OF THE INVENTION

The invention aims to overcome all or part of the aforementioned problems by providing a precision actuator that can operate around its initial position with a symmetrical travel and a controlled coefficient of expansion.

For this purpose, one subject of the invention is an actuator comprising:
- a base
- an intermediate structure,
- an output interface, characterized in that it comprises two linear elements producing a controllable extension in the same longitudinal direction, each between a first and a second end, a first of the two elements having a first end fixed onto the intermediate structure and a second end fixed onto the base, a second of the two elements having a first end fixed onto the intermediate structure and a second end fixed to the output interface, and in that the base and the intermediate structure are positioned in such a manner that the controllable extension of the second element produces a displacement of the actuator in a first direction and the controllable extension of the first element produces a displacement of the actuator in a second direction, opposite to the first direction, with respect to the base.

BRIEF DESCRIPTION OF THE DRAWINGS

The invention will be better understood and other advantages will become apparent upon reading the detailed description of one embodiment presented by way of example, the description being illustrated by the appended drawing in which.

For the sake of clarity, the same elements will carry the same identification numbers in the various figures.

DETAILED DESCRIPTION

Figure 1:
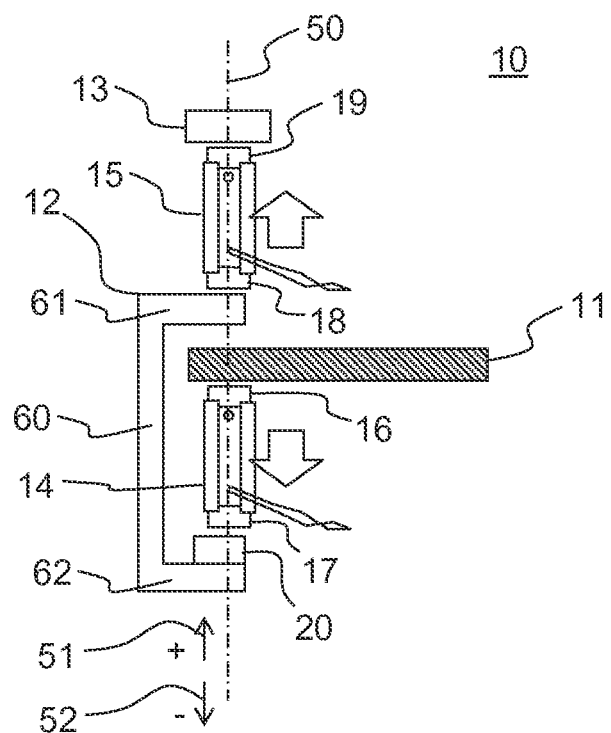
FIG. 1 shows schematically an actuator according to the invention.

FIG. 1 shows schematically an actuator 10 according to the invention. The actuator 10 comprises a base 11, an intermediate structure 12, an output interface 13. The actuator 10 comprises two linear elements 14, 15 producing a controllable extension in the same longitudinal direction 50, each between a first and a second end. A first 14 of the two elements has a first end 16 fixed onto the intermediate structure 12 and a second end 17 fixed onto the base 11. A second 15 of the two elements has a first end 18 fixed onto the intermediate structure 12 and a second end 19 fixed to the output interface 13. The base 11 and the intermediate structure 12 are positioned in such a manner that the controllable extension of the second element 15 produces a displacement of the actuator 10 in a first direction 51 and the controllable extension of the first element 14 produces a displacement of the actuator 10 in a second direction 52, opposite to the first direction 51, with respect to the base. In FIG. 1, two elements are shown. An actuator comprising several other elements, for example 3, 4 or more, could perfectly well be envisioned.

The base 11, the intermediate structure 12, the output interface 13 and the two elements 14, 15 form several components forming a stack. Thus, when the element 15 is extended, it moves the stack in the direction 51. When the element 14 is extended, it moves the intermediate structure 12 in the direction 52. An actuator capable of having a symmetrical travel around its initial position is thus obtained.

Figure 4:
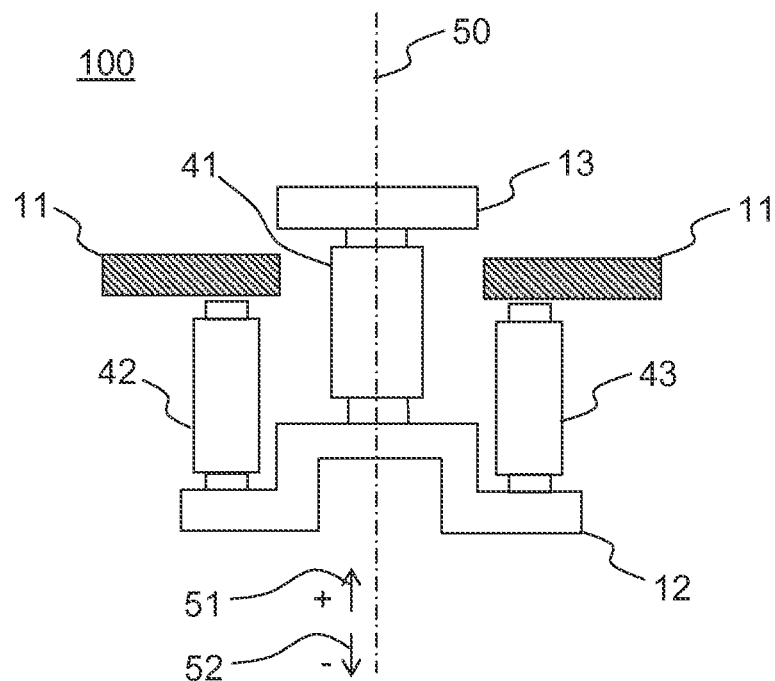
FIG. 4 shows schematically an actuator according to the invention.

Furthermore, the intermediate structure 12 may take various forms. What may notably be distinguished is an intermediate structure referred to as axial with elements superposed in the longitudinal direction (as is the case in FIG. 1) of an intermediate structure referred to as lateral such as for the actuator 100 shown in FIG. 4. The actuator 100 is identical to the actuator 10 except that the actuator 100 comprises three elements 41, 42 and 43. The elements 41, 42 and 43 have a controllable extension in the longitudinal direction 50. They are positioned one next to the other parallel to the longitudinal direction 50. The element 41 has a controllable extension in the direction 51 and the extension of the elements 42 and 43 moves the actuator 100 in the direction 52. In FIG. 4, three elements are shown. The actuator 100 could comprise several others of them. For example, the element 41 could be replaced by two elements. An actuator with an intermediate structure referred to as axial occupies a larger space in the longitudinal direction, whereas an actuator with an intermediate structure referred to as lateral occupies a smaller space in the longitudinal direction but takes up more space in the lateral direction. In practice, the shape of the intermediate structure 12 is chosen according to the space that may be occupied by the actuator 10 within its environment.

The intermediate structure 12 is configured in such a manner that the thermal expansion coefficient of the actuator 10 has a predetermined value. Indeed, by choosing the thicknesses and materials of the intermediate structure 12 appropriately, a stack can then be obtained that is referred to as athermal. An expansion of the actuator 10 subjected to a given rise in temperature is now considered. When expanding, the element 15 gets longer by a distance e in the direction 51. By choosing elements 14 and 15 that are identical or at least similar, the element 14 expands in the same way, in other words the element 14 also expands by a distance e. However, since the element 14 is positioned between the base 11 and the intermediate structure 12, the expansion of the element 14 results in a displacement of the intermediate structure 12 by a distance e in the direction 52. The expansion of the element 15 and the expansion of the element 14 compensate for each other.

Aside from the elements 14 and 15, other components of the stack may be formed from materials whose coefficients of expansion are as low as possible. The intermediate structure 12 and the base 11 are for example composed of an alloy of iron (64%) and nickel (36%). This alloy has a very low coefficient of expansion ($1.2 \times 10^{-6}$ $K^{-1}$). The intermediate structure 12 and the base 11 may also be made of ceramic, for example silicon nitride. The output interface 13 can be made of glass of vitro-ceramic type and can also have a very low thermal expansion coefficient.

Components of the stack having higher coefficients of expansion may be chosen while at the same time conserving an overall thermal expansion coefficient for the stack of zero. It is also possible for the overall thermal expansion coefficient of the stack to be zero by inserting intermediate components. The intermediate structure 12 can have a U shape composed of a central part 60 parallel to the longitudinal direction 50, of a first part 61 onto which the second element 15 is fixed and of a second part 62 parallel to the first part 61, substantially perpendicular to the central part 60.

In the case of expansion of the intermediate structure 12, it is the part 60 that expands in a significant manner in the longitudinal direction 50. The element 15 therefore moves with the expansion of the intermediate structure 12. The actuator 10 may comprise a thermal regulation insert 20 positioned between two components of the stack. Advantageously, the thermal regulation insert 20 is positioned between the second part 62 and the first element 14. In other words, the insert 20 is positioned between the first end of the first element 14 and the intermediate structure 12. The insert 20 may be formed so as to adjust the length of the central part 60 of the intermediate structure 12. The insert 20 may be formed from a material with a high thermal expansion coefficient. The insert 20 then expands as much as the intermediate structure 12 and moves the intermediate structure 12 in the direction 52 so as to counter-balance the displacement in the direction 51 due to the expansion of the intermediate structure 12. Placed between the element 14 and the intermediate structure 12, the insert 20 allows an overall thermal expansion coefficient of the stack of zero to be obtained. The adjustment of the height of the insert 20 regulates the coefficient of expansion of the stack both in the increasing and in the decreasing direction.

In operation, the element 14 extends at its second end; it is said to pull on the intermediate structure 12. The element 15 mounted on the intermediate structure 12 extends at its second end; it is said to push the actuator. Mechanically, each of the two elements 14, 15 provides half of the travel; this is what is referred to as a "return" operation. An actuator 10 is thus obtained with a symmetrical travel.

When the actuator 10 operates in an environment subjected to variations in temperature, the two elements 14, 15 expand. The return operation allows the output interface 13 of the actuator to remain fixed. In other words, the actuator 10 is insensitive to a simultaneous expansion of the elements, a fact which endows it with a positioning precision.

The elements 14, 15 may be based on piezoelectric, magnetostrictive or electrostrictive materials.

The elements 14, 15 may be equipped with flexible guiding elements allowing the actuator 10 to be rigidified.

The actuator 10 can be used with a travel amplification. The travel amplification is achieved thanks to a mechanical device to which the actuator 10 is connected by use of a lever arm. The travel amplification allows a longer travel to be obtained to the detriment of the rigidity and of the precision.

Advantageously, the elements 14, 15 are identical.

Figure 2:
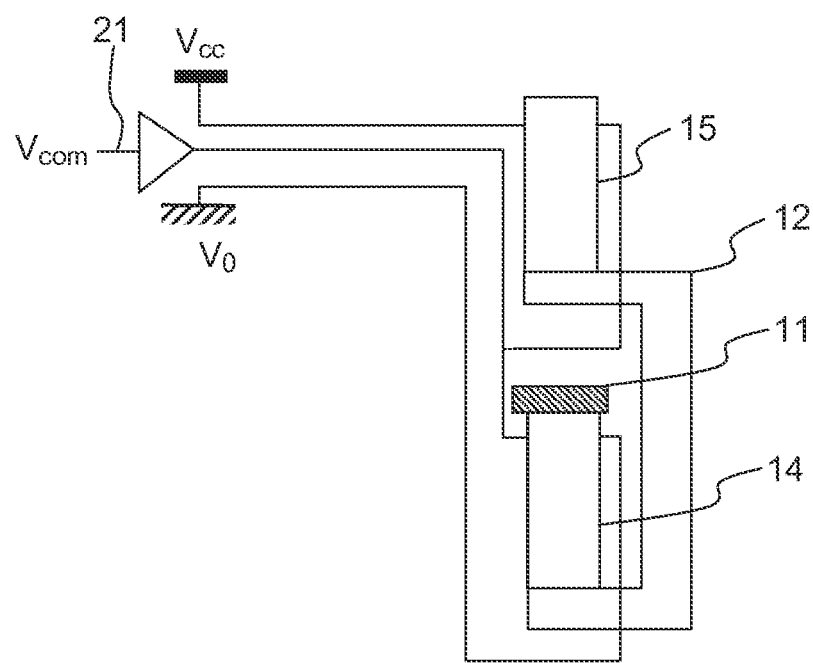
FIG. 2 shows schematically the power supply for the actuator.

FIG. 2 shows schematically the power supply for the actuator 10. The actuator 10 comprises a control 21 common to the two elements 14, 15. The control 21 is configured so as to have a first effect on one element and a second effect, inverse to the first effect, on the second element. The inversed-effect control 21 is for example carried out by means of three voltages V0, Vcc and Vcom. The voltages V0 and Vcom are fixed and the voltage Vcom varies between V0 and Vcc. The element 14 is controlled between the voltages V0 and Vcom. The element 15 is controlled between the voltages Vcom and Vcc. Thus, the voltage across the terminals of the element 15 is Vcc−Vcom and the voltage across the terminals of the element 14 is Vcom−V0. The common control 21 has an amplitude A close to Vcc−Vcom. A reference position, also called initial position or mechanical zero, of the actuator 10 is defined for a control value equal to A/2. The common control 21 acts on Vcom which will generate a positive voltage variation (respectively negative) between the terminals of the element 14 (respectively 15) and vice versa. Under the effect of this voltage variation across the terminals of each of the elements 14, 15, this results in an extension (respectively retraction) of one of the two elements. In other words, by varying Vcom negatively for example, the voltage across the terminals of the element 15 increases. The element 15 extends in the longitudinal direction 50 in the direction 51 and thus moves the output interface by a distance d/2. By varying Vcom positively, the voltage across the terminals of the element 14 increases. The element 14 extends in the longitudinal direction 50 in the direction 51 and, since the second end of the element 14 is fixed onto the base 11, thus moves the intermediate structure 12, in other words the actuator 10 is moved by a distance d/2 in the longitudinal direction 50 in the direction 52. The travels of each element are added together. The actuator 10 therefore has a travel equal to d. In practice, long travel lengths may be obtained, of the order of around thirty micrometers. The travel thus obtained will generate a displacement of the actuator 10 allowing the intermediate mirror (not shown in FIG. 2) to be deformed in the desired direction and with the desired amplitude.

The common control 21 allows a good linearity around the mechanical zero to be obtained with the amplitude A/2, thus ensuring a high precision (of the order of a nanometer) and a high stability. Indeed, in the case of a separate power supply for the elements, and hence of a separate control, it is necessary to switch from one control to another, a fact which renders the control more complex.

Furthermore, the common control 21 simplifies the implementation of such an actuator and is particularly beneficial in the case where several actuators are used.

Finally, in the case of a failure, for example if the actuator 10 is no longer powered, the common control 21 is particularly advantageous. The actuator 10 remains in its reference position at the mechanical zero, whereas in the case of an actuator having for example a travel in the range between −5 µm and +40 µm with a separate power supply, the actuator gets blocked in an end position.

Figure 3A:
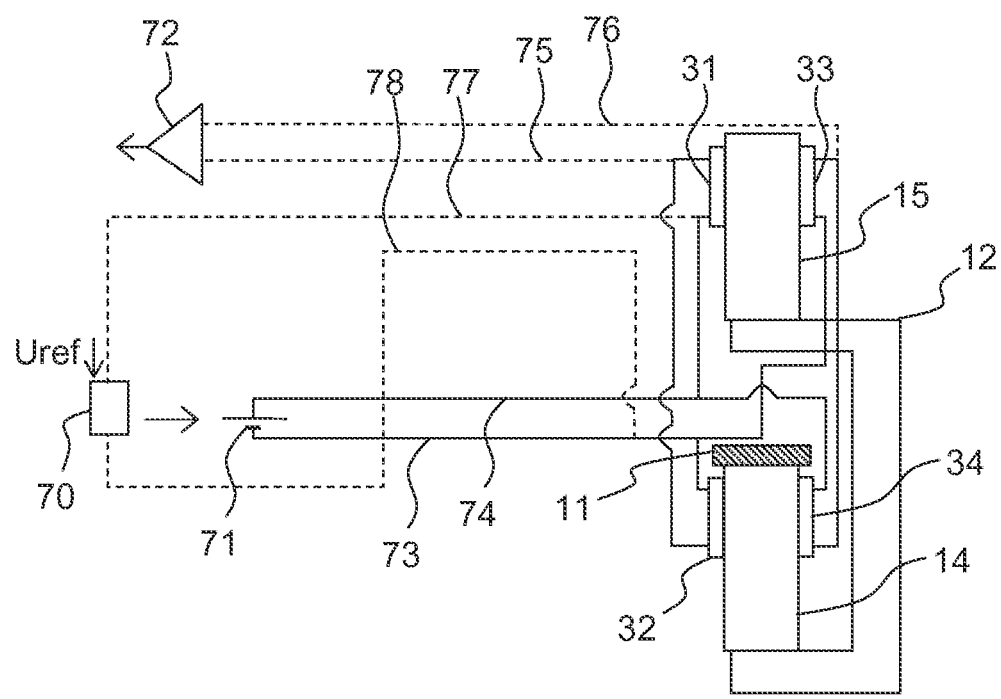
FIG. 3a shows schematically the placement of the deformation gauges on the actuator.

FIG. 3a shows schematically one example of placement of four deformation gauges on the actuator 10. The actuator 10 comprises deformation gauges mounted on the elements 14, 15. The elements 14, 15 each comprise two deformation gauges which are deformed according to the extension of the elements. The element 14 comprises two deformation gauges 32, 34 and the element 15 comprises two deformation gauges 31, 33. The gauges are connected so as to amplify the effect with a view to a measurement of the extension between the base 11 and the output interface 13. The gauges 31, 32, 33, 34 allow the deformation of the elements 14 and 15 in the longitudinal direction 50 to be measured.

It is to be noted that a simplified configuration using one gauge may also be envisioned. This case is known as a half-bridge configuration. However, this configuration is sensitive to the bending of the actuator.

A deformation gauge is a very fine resistant wire printed or adhesively bonded onto an insulating medium placed on the element whose deformation it is desired to quantify. When the medium is deformed, the wire is stretched. Its electrical resistance then varies in proportion to the variation in length. By measuring the resistance variation, its deformation is deduced, and consequently the deformation of the element. In order to transmit the deformations of the element as faithfully as possible, the medium carrying the gauge must have very specific characteristics. A good aptitude for adhesive bonding, a low coefficient of expansion and also an ability to withstand temperature variations may for example be noted.

The variations in resistance of the deformation gauges are too small to be directly measurable. The deformation gauges are consequently assembled according to a full-bridge electrical configuration which allows the variation in resistance to be accessed. In FIG. 3a, the deformation gauges 31, 32, 33, 34 are placed on the elements 14, 15 under the same adhesive bonding conditions.

Figure 3B:
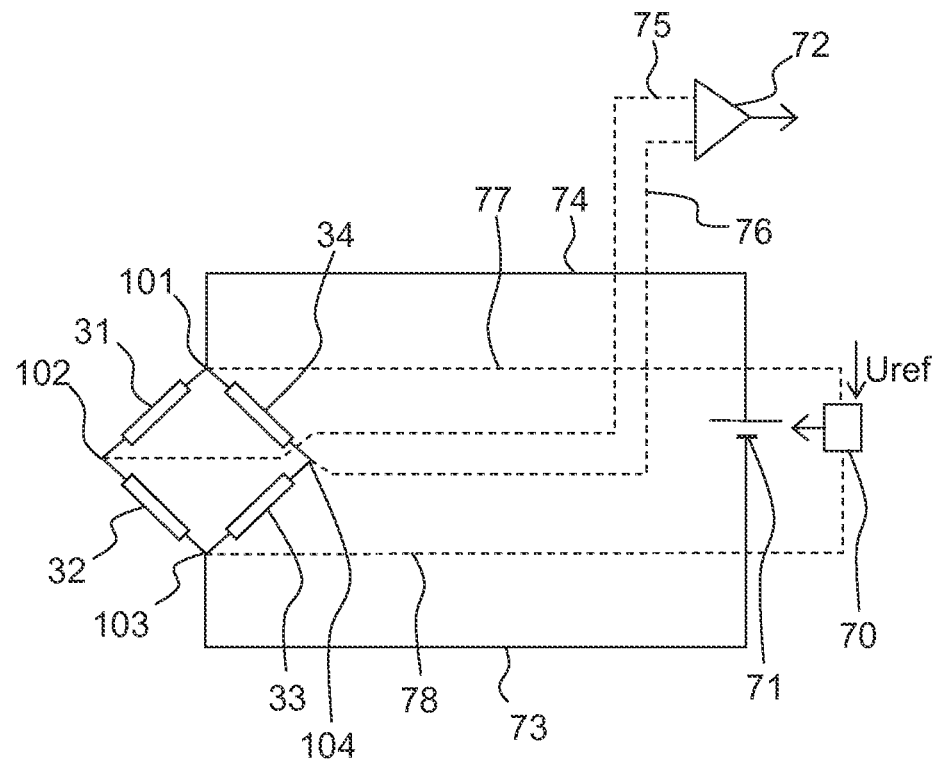
FIG. 3b illustrates the full-bridge configuration of the deformation gauges.

FIG. 3b illustrates the full-bridge configuration of the deformation gauges 31, 32, 33, 34. The gauge 31 is situated between two points 101 and 102, the gauge 32 is situated between two points 102 and 103, the gauge 33 is situated between two points 103 and 104 and the gauge 34 is situated between the points 104 and 101. The gauges 31 and 32 are connected in series between the points 101 and 103. Similarly, the gauges 33 and 34 are connected in series between the points 101 and 103. The voltage across the terminals of the gauges 31 and 32 connected in series, which is the same as the voltage across the terminals of the gauges 33 and 34, is referred to as the supply voltage for the bridge.

A full-bridge configuration allows an optimum sensitivity to be obtained. There is no bias in the measurement of the extension of the elements, the bridge is only sensitive to the useful deformations. In other words, in case of thermal deformation of the elements 14 and 15, the four gauges see their resistance being modified simultaneously and in the same direction. When such a modification occurs, the output voltage of the bridge remains unchanged. The gauge bridge is connected to a comparator 72 which powers the sensor, processes and amplifies the value of the measurement.

FIGS. 3a and 3b also show the power supply of the actuator 10 by a power supply circuit 71. Two wires 73, 74 power the bridge. Two other wires 75, 76 return the unbalance of the bridge to the comparator 72 when the electrical resistances of the gauges vary. Two other wires 77, 78, also called return wires, allow a measurement of the supply voltage between the points 101 and 103 which is returned to a comparator 70. The comparator 70 then acts on the power supply circuit 71 so as to keep the power supply voltage constant. This configuration with 6 wires allows the in-line losses that can occur because of the resistance of the cabling to be eliminated.

Figure 5:
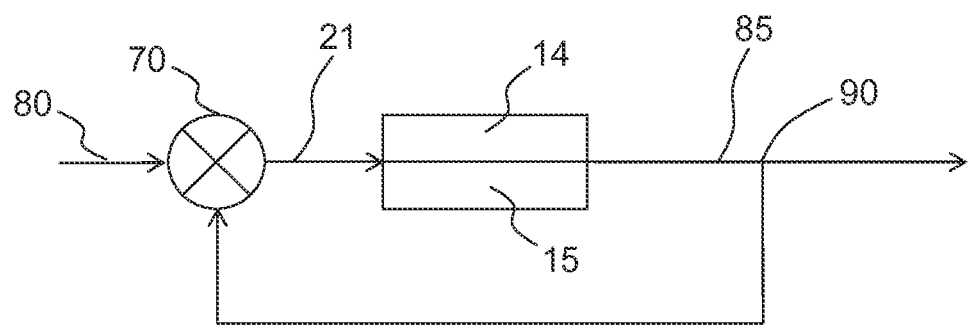
FIG. 5 shows the closed-loop feedback of the control of the actuator as a function of a measurement of extension of the actuator.

FIG. 5 shows the closed-loop feedback of the control of the actuator 10 as a function of a measurement 90 of extension of the actuator 10 coming from the comparator. The actuator 10 comprises an active closed loop between the common control 21 to the two elements 14, 15 and the measurement 90 of the extension of the elements. In order to deform the intermediate mirror in the desired direction, an initial command 80 indicates to the power supply circuit 71 to power the bridge. The elements 14, 15 are deformed in the longitudinal direction 50 in the desired sense. A deformation 85 in the longitudinal direction 50 of the elements 14, 15 can be quantified by a measurement 90 of the deformations by virtue of the deformation gauges. This measurement 90 can be returned to a comparator 70 which compares the measured value to the initial setpoint value and adjusts the power supply voltage of the bridge accordingly. The actuator 10 comprises a closed-loop feedback of the control 21 as a function of a measurement of the extension between the base 11 and the output interface 13.

In the case where there is no control 21 common to the two elements 14 and 15, in other words if the elements 14 and 15 have a separate control, the actuator 10 then comprises one loop per element.

The actuator 10 according to the invention thus disposes of a large travel that is symmetrical around its reference position. It is athermal. It has a simple control and closed-loop feedback. Lastly, it occupies a reasonable volume while at the same time having robustness and lifetime characteristics compatible with a use in the field of space applications.

The invention claimed is:

1. An actuator comprising:
a base,
an intermediate structure,
an output interface, and
two linear elements producing a controllable extension in the same longitudinal direction, each between a first and a second end, a first of the two elements having a first end fixed onto the intermediate structure and a second end fixed onto the base, a second of the two elements having a first end fixed onto the intermediate structure and a second end fixed to the output interface,
wherein the base and the intermediate structure are positioned in such a manner that the controllable extension of the second element produces a displacement of the output interface in a first direction and the controllable extension of the first element produces a displacement of the output interface in a second direction, opposite to the first direction, with respect to the base, and
wherein the actuator comprises deformation gauges mounted on the elements, wherein the gauges are connected so as to amplify the effect with a view to a measurement of the extension between the base and the output interface; and
wherein the base, the intermediate structure, the output interface and the two elements form several components forming a stack and wherein it comprises a thermal regulation insert positioned between two components of the stack.

2. The actuator according to claim 1, wherein the intermediate structure has a U shape composed of a central part parallel to the longitudinal direction, of a first part onto which the second element is fixed and of a second part parallel to the first part, substantially perpendicular to the central part, and wherein the thermal regulation insert is positioned between the second part and the first element.

3. The actuator according to claim 1, wherein the intermediate structure is configured in such a manner that the thermal expansion coefficient of the actuator has a predetermined value.

4. The actuator according to claim 3, wherein the elements are based on piezoelectric, magnetostrictive or electrostrictive materials.

5. The actuator according to claim 4, wherein the elements are identical.

6. The actuator according to claim 1, further comprising a control common to the two elements, and wherein the control is configured so as to have a first effect on one element and a second effect, inverse to the first effect, on the second element.

7. The actuator according to claim 6, further comprising a closed-loop feedback of the control as a function of a measurement of the extension between the base and the output interface.

8. Use of an actuator according to claim 6, whose common control has an amplitude A, wherein it consists in defining a reference position of the actuator for a control value equal to A/2.

* * * * *